United States Patent [19]

Kirlin et al.

[11] Patent Number: 5,204,314
[45] Date of Patent: Apr. 20, 1993

[54] METHOD FOR DELIVERING AN INVOLATILE REAGENT IN VAPOR FORM TO A CVD REACTOR

[75] Inventors: Peter S. Kirlin, Brookfield; Robin L. Binder, Bethlehem; Robin A. Gardiner, Bethel, all of

[73] Assignee: Advanced Technology Materials, Inc., Danbury, Conn.

[21] Appl. No.: 807,807

[22] Filed: Dec. 13, 1991

Related U.S. Application Data

[63] Continuation of Ser. No. 549,389, Jul. 6, 1990, abandoned.

[51] Int. Cl.$^5$ .......................... C23C 16/00; B05D 5/12
[52] U.S. Cl. ........................................ 505/1; 505/734; 505/730; 427/62; 427/255.3; 427/255.2; 427/255.1; 427/126.3; 427/419.1; 427/419.2; 118/726
[58] Field of Search .............. 505/1, 734, 730; 427/62, 63, 255.3, 255.2, 255.1, 126.3, 248.1, 314, 419.1, 419.2; 118/726; 219/6.5, 10.41; 261/DIG. 65; 159/906

[56] References Cited

U.S. PATENT DOCUMENTS

| | | | |
|---|---|---|---|
| 2,954,330 | 9/1960 | Schmieding et al. | 202/236 |
| 3,549,412 | 12/1970 | Frey, Jr. et al. | 427/217 |
| 3,894,164 | 7/1975 | Dismukes et al. | 427/248.1 |
| 3,978,272 | 8/1976 | Donley | 428/434 |
| 4,080,926 | 3/1978 | Platakis et al. | 118/5 |
| 4,501,602 | 2/1985 | Miller et al. | 65/18.2 |
| 4,732,110 | 3/1988 | Parsons | 118/719 |
| 4,735,852 | 4/1988 | Osada | 428/336 |
| 4,804,649 | 2/1989 | Sherif | 505/1 |
| 4,842,893 | 6/1989 | Yializis et al. | 427/44 |
| 4,845,308 | 7/1989 | Womack, Jr. | 174/15.4 |
| 4,882,312 | 11/1989 | Mogro-Campero | 505/1 |
| 4,908,348 | 3/1990 | Hung et al. | 505/1 |
| 4,915,988 | 4/1990 | Erbil | 427/252 |
| 4,931,425 | 6/1990 | Kimura et al. | 505/1 |
| 4,935,385 | 6/1990 | Biegelsen | 437/111 |
| 4,940,693 | 7/1990 | Shappirio et al. | 505/1 |
| 4,954,371 | 9/1990 | Yializis | 427/44 |

FOREIGN PATENT DOCUMENTS

| | | |
|---|---|---|
| 0323345A2 | 7/1989 | European Pat. Off. |
| 0328333 | 8/1989 | European Pat. Off. |
| 0331483A2 | 9/1989 | European Pat. Off. |

OTHER PUBLICATIONS

"Epitaxial Film Growths of Artificial (Bi-O)/(Sr-Ca-Cu-O) Layered Structures" Fujita, J., et al, Appl. Phys. Lett., vol. 54, No. 23, Jun., 1989, pp. 2364-2366.

"High $T_c$ Oxide Superconductors," Maple, M. B., Ed., MRS Bulletin, Jan. 1989, pp. 20-21.

(List continued on next page.)

*Primary Examiner*—Shrive Beck
*Assistant Examiner*—Roy V. King
*Attorney, Agent, or Firm*—Steven J. Hultquist

[57] ABSTRACT

A process and apparatus for delivering an involatile reagent in gaseous form, wherein an involatile reagent source liquid is flash vaporized on a vaporization matrix structure at elevated temperature. A carrier gas may be flowed past the flash vaporization matrix structure to yield a carrier gas mixture containing the flash vaporized source reagent. The matrix structure preferably has a high surface-to-volume ratio, and may suitably comprise a foraminous matrix element such as screen mesh onto which the reagent source liquid is distributed for flash vaporization. The invention is particularly useful for delivery of Group II reagents and compounds and complexes of early transition metals such as zirconium and hafnium, and may be usefully employed with Group II beta-diketonate source materials to form high temperature superconducting material layers, e.g., of YBaCuO, BiSrCaCuO, and TlBaCaCuO types, as well as for forming interlayers of Group II metal fluorides between gallium arsenide or silicon substrates and high temperature superconductor or gallium arsenide overlayers, and for depositing thin films of photonic and ferroelectric materials, e.g., $BaTiO_3$, $Ba_xSr_{1-x}Nb_2O_6$, and $PbZr_{1-x}Ti_xO_3$.

25 Claims, 3 Drawing Sheets

OTHER PUBLICATIONS

"Effect of Noble Metal Buffer Layers on Superconducting $YBa_2Cu_3O_7$ Thin Films," Appl. Phys. Lett., Dec. 1987, vol. 51, pp. 2155–2157.

"Suitability of Metal Beta-Diketonates as MOCVD-Precursors for High $T_c$ Superconductors" C. I. M. A. Spee, et al, MRS Fall Meeting, Boston, Massachusetts, Nov. 27–Dec. 2, 1989, p. 1.

"Thin Films of Barium Fluoride Scintillator Deposited by Chemical Vapor Deposition," P. S. Kirlin, et al. Apr. 1990 pp. 261–264.

"Growth of High $T_c$ YBaCuO Thin Films by Metalorganic Chemical Vapor Deposition" P. S. Kirlin, et al, SPIE vol. 1187 Oct. 1989 pp. 115 to 127.

Mizuno et al, "Low-temperature deposition of Y-Ba-Cu-O films on a $CaF_2$/GaAs substrate", Appl. Phys. lett. 54(4) Jan. 1989 pp. 383–385.

Wu et al, "High critical currents in epitaxial $YBa_2Cu_3O_{7-x}$ thin films on silicon with buffer layers", Appl. Phys. lett. 54(8) Feb. 1989 pp. 754–756.

Hamaguchi et al, "Reduced Pressure MOCVD of C-axis oriented BiSrCaCuO thin films", Jpn. J. Appl. Phys. 29(4) Apr. 1990 L596–599.

Panson et al, "Chemical vapor deposition of $YBa_2Cu_3O_7$ using metalorganic chelate precursors", Appl. Phys. lett. 53(18) Oct. 1988 pp. 1756–1758.

Radpour et al, "Preparation of Y-Ba-Cu-O superconducting thin films using $BaF_2$ as a buffer layer", Appl. Phys. lett. 54(24) Jun. 1989, pp. 2479–2480.

Zhao et al, "Organometallic chemical vapor deposition of high Tc superconducting films using a volatile, fluorocarbon-based precursor" Appl. Phys. lett. 53(18) Oct. 1988 pp. 1750–1752.

Blocher, Jr., "Chemical vapor deposition" from Deposition Technologies for films and coatings by Bunshah et al, Noyes Publications (1982) (pp. 335 and 339).

METHOD FOR DELIVERING AN INVOLATILE REAGENT IN VAPOR FORM TO A CVD REACTOR

GOVERNMENT RIGHTS IN INVENTION

This invention was made with Government support under Contract No. N00014 88-0531 awarded by the Defense Advanced Projects Research Administration (DARPA). The Government has certain rights in this invention.

CROSS-REFERENCE TO RELATED APPLICATION

This is a File Wrapper Continuation of U.S. application No. 07/549,389 filed Jul. 6, 1990 and now abandoned.

BACKGROUND OF THE INVENTION

1. Field of The Invention

This invention relates to an apparatus and method for delivering involatile reagents, e.g., materials comprising Group II elements of the Periodic Table, in a form suitable for introduction into a deposition zone wherein films or layers are formed on a substrate by decomposition of the reagent.

2. Description of the Related Art

Recently many refractory materials have been identified as having unique materials properties. The recently discovered high temperature superconducting (HTSC) materials include $YBa_2Cu_3O_x$, wherein x is from about 6 to 7.3, BiSrCaCuO, and TlBaCaCuO. Barium titanate, $BaTiO_3$, has been identified as a ferroelectric and photonic material with unique and potentially very useful properties. $Ba_xSr_{1-x}Nb_2O_6$ is a photonic material whose index of refraction changes as a function of electric field and also as a function of the intensity of light upon it. Lead zirconate titanate, $PbZr_{1-x}Ti_xO_3$, is a ferroelectric material whose properties are very interesting. The Group II metal fluorides, $BaF_2$, $CaF_2$, and $SrF_2$, are materials that are useful for scintillation detecting and coating of optical fibers.

Many of the potential applications of these materials require their use in thin film, coating, or layer form. The films or layers may also be advantageously epitaxially related to the substrate upon which they are formed. Applications in which the refractory materials may need to be deposited in film or layer form include integrated circuits, switches, radiation detectors, thin film capacitors, holographic storage media, and various other microelectronic devices.

Uses that are currently envisioned for the copper oxide superconductors include high speed switches, bolometers, and high frequency communications components such as mixers. These applications would desirably use the HTSC material in the form of thin films in devices that can be made using well-known microelectronic fabrication technology.

Thin films comprising the Group II metal fluorides, $BaF_2$, $CaF_2$, and $SrF_2$, are potentially very useful as buffer layers for interfacing between silicon substrates and HTSC or GaAs overlayers or between GaAs substrates and HTSC or silicon overlayers, and combinations of two or all of such metal fluorides may be employed in forming graded compositions in interlayers providing close lattice matching at the interfaces with the substrate and overlayer constituents of the composite. For example, a silicon substrate could be coated with an epitaxial layer of $BaF_2/CaF_2$, $SrF_2/CaF_2$, or $SrF_2/CaF_2/BaF_2$, whose composition is tailored for a close lattice match to the silicon. If the ratio of the respective Group II metal species in the metal fluoride interlayers can be controlled precisely in the growth of the interlayer, the lattice constant could be graded to approach the lattice constant of GaAs. Thus, a gallium arsenide epitaxial layer could be grown over the metal fluoride interlayer, allowing the production of integrated GaAs devices on widely available, high quality silicon substrates. Another potential use of such type of metal fluoride interlayers would be as buffers between silicon substrates and polycrystalline HTSC films for applications such as non-equilibrium infrared detectors. Such an interlayer would permit the HTSC to be used in monolithic integrated circuits on silicon substrates.

$BaTiO_3$ and $Ba_xSr_{1-x}Nb_2O_6$ in film or epitaxial layer form are useful in photonic applications such as optical switching, holographic memory storage, and sensors. In these applications, the $BaTiO_3$ or $Ba_xSr_{1-x}Nb_2O_6$ film is the active element. The related ferroelectric material $PbZr_{1-x}Ti_xO_3$ is potentially useful in infrared detectors and thin film capacitors well as filters and phase shifters.

Chemical vapor deposition (CVD) is a particularly attractive method for forming these layers because it is readily scaled up to production runs and because the electronics industry has a wide experience and an established equipment base in the use of CVD technology which can be applied to new CVD processes. In general, the control of key variables such as stoichiometry and film thickness, and the coating of a wide variety of substrate geometries is possible with CVD. Forming the thin films by CVD will permit the integration of these materials into existing device production technologies. CVD also permits the formation of layers of the refractory materials that are epitaxially related to substrates having close crystal structures.

CVD requires that the element source reagents must be sufficiently volatile to permit gas phase transport into the deposition reactor. The element source reagent must decompose in the reactor to deposit only the desired element at the desired growth temperatures. Premature gas phase reactions leading to particulate formation must not occur, nor should the source reagent decompose in the lines before reaching the reactor deposition chamber. When compounds, especially the HTSC materials, are desired to be deposited, obtaining optimal properties requires close control of stoichiometry which can be achieved if the reagent can be delivered into the reactor in a controllable fashion. Close control of stoichiometry would also be desired, for example, in the application described above involving graded Group II metal fluoride interlayers.

Many potentially highly useful refractory materials have in common that one or more of their components are elements, such as the Group II metals barium, calcium, and strontium, or early transition metals such as zirconium or hafnium, for which no volatile compounds well-suited for CVD are known. In many cases, the source reagents are solids which can be sublimed for gas-phase transport into the reactor. However, the sublimation temperature may be very close to the decomposition temperature, in which case the reagent may begin to decompose in the lines before reaching the reactor, and it will be very difficult to control the stoichiometry of the deposited films.

The formation of multicomponent refractory and electronic thin films such as high temperature superconductors [see K. Shinohara, F. Munakata, and M. Yamanaka, *Jpn. J. Appl. Phys.* 27, L1683 (1988); and K. Zhang, E. P. Boyd, B. S. Kwak, and A. Erbil, *Appl. Phys. Lett.* 55, 1258 (1989)] and ferroelectrics [see C. J. Brierley, C. Trundle, L. Considine, R. W. Whatmore, and F. W. Ainger, *Ferroelectrics* 91, 181 (1989); and F. W. Ainger, C. J. Brierley, M. D. Hudson, C. Trundle, and R. W. Whatmore, *Ferroelectric Thin Films*, E. R. Myers and A. I. Kingdon, Eds., Materials Research Society, Pittsburgh, Pa., 1990] by CVD or metalorganic CVD (MOCVD) has been only marginally successful. These materials have placed new demands on CVD technology, with the primary stumbling blocks being the inability to achieve exacting control of the stoichiometry of the multicomponent films and the absence of volatile source reagents. In many instances the source reagents are solids which decompose at temperatures near or slightly above the temperature at which they sublime.

Organogroup I and II complexes are particularly problematic. With the use of conventional bubblers, the bubbler is held at a temperature sufficiently high to sublime the reagent and consequently significant and somewhat variable decomposition of the source reagents occurs during a single growth run. This premature decomposition causes variations in the composition as a function of thickness in the as-deposited films and poor reproducibility in film stoichiometry between different growth runs.

Inexacting compositional control is particularly deleterious to high temperature superconducting thin films because the superconducting properties are extremely sensitive to the stoichiometry of the layer [see K. Wasa, H. Adachi, Y. Ichikawa, K. Setsune, and K. Hirochi, *Review Solid State Sci.* 2, 453 (1988); and R. F. Bunshsh, and C. V. Deshpandey, *Research and Development* 65 (1989)]. Two approaches involving the use of nonconventional hardware have been tried to overcome this problem. The first method eliminates the bubblers and uses a reactor tube which contains concentric tubes, each containing a boat filled with a single source reagent. A temperature gradient is applied along the tube to vaporize each material at the required temperature [see M. Ihara, T. Kimura, H. Yamawaki, and K. Ikeda, *IEEE Trans. Magnetics* 25, 2471 (1989); and H. Yamane, H. Kurosawa, T. Hirai, K. Watanabe, H. Iwasaki, N. Kobayashi, and Y. Muto, *J. Crystal Growth* 98, 860 (1989]. There are several drawbacks to this method: (1) as with standard bubblers, significant decomposition occurs during a given run because the reagents are held at high temperatures for the duration of the run; (2) temperature control is not as good as with standard bubblers, thus giving rise to wide variations in source reagent vapor pressure and consequently to wide variations in the stoichiometry of the as-deposited films, and (3) the boats need to be charged before each run, a step which is not consistent with a high volume commercial process.

The second method uses two bubblers in series. The first bubbler contains a volatile chelating ligand which presumably acts to stablize and/or to lower the melting point of the source reagent which is contained in the second (downstream) bubbler, [see P. H. Dickinson, T. H. Geballe, A. Sanjurjo, D. Hildenbrand, G. Craig, M. Zisk, J. Collman, S. A. Banning, and R. E. Sievers, *J. Appl. Phys,* 66 444 (1989)]. Stabilities on the order of a few hours which are sufficient for a single run have been realized with this method. However, a fresh charge of source reagent is needed before each run. In addition, some enhancement in the vapor pressure of the source reagent occurs. Unfortunately, the amount of enhancement is not reproducible, which again causes variations in the stoichiometry of the as-deposited films.

Standard CVD processes, such as the deposition of tungsten metallization layers from tungsten hexafluoride and silane [see R. S. Rosler, J. Mendonca, M. J. Rice, Jr., *J. Vac, Sci. Technol.,* B6, 1721 (1988)], which use gaseous or liquid source reagents, are not plagued by source reagent decomposition. Furthermore, deposition conditions (i.e., substrate temperature, reactor pressure, and partial pressures of the source reagents) can typically be found where the growth of the desired phase is kinetically or thermodynamically favored over individual impurity phases. For example, the MOCVD of single crystal GaAs thin films is carried out with an arsine+trimethylgallium mixture in which there is typically a 30 to 60-fold excess of the group V source reagent Under appropriately selected conditions, the excess arsine either does not react or the extra arsenic evaporates before it can be incorporated into the rowing film [see T. F. Kuech, *Mat. Sci. Reports,* S. S. Lau and F. W. Saris, Eds 2, 1 (1987)].

By contrast, during CVD processes for refractory materials, the vapor pressures of the binary oxides, nitrides, and carbides are often lower than that of the desired multicomponent phase at the deposition temperature. Thus any excess source reagent leads to the deposition of a binary oxide or carbide which is then incorporated as an impurity phase in the growing film.

In summary, the techniques heretofore employed for formation of refractory thin films from relatively involatile reagents have not permitted efficient delivery of the reagents into the reactor and close control of reagent ratios and hence film stoichiometry.

Other objects and advantages of the present invention will be more fully apparent from the ensuing disclosure and appended claims.

SUMMARY OF THE INVENTION

In one aspect, the present invention relates to a process for supplying an involatile reagent in vapor form, comprising:

providing the involatile reagent in the form of a reagent source liquid;

providing a flash vaporization matrix structure, preferably a foraminous structure having a surface-to-volume ratio of suitably high value, e.g., at least 4, and which is heatable to a temperature sufficient to flash vaporize the reagent source liquid thereon;

heating the flash vaporization matrix structure to at least said temperature sufficient to flash vaporize the reagent source liquid thereon; and applying the reagent source liquid onto the heated flash vaporization matrix structure to flash vaporize the reagent source liquid thereon.

As described more fully hereinafter, the reagent source liquid may comprise a solvent solution of the involatile reagent, when the involatile reagent is a solid or liquid, or else the reagent source liquid may consist of the involatile reagent itself, when the involatile reagent is a suitable liquid.

In a further aspect, the process described above may additionally comprise flowing a carrier gas past the flash vaporization matrix structure to form a carrier gas mixture containing the flash vaporized reagent source liquid.

In another aspect, the present invention relates to an apparatus for forming a vapor of an involatile reagent, comprising:

- a reservoir for supplying an involatile reagent source liquid;
- a flash vaporization matrix structure, preferably having a surface-to-volume ratio of at least 4;
- means for heating the flash vaporization matrix structure to a temperature sufficient to flash vaporize reagent source liquid thereon; and
- means for delivering reagent source liquid from the reservoir to the flash vaporization matrix structure for contact with the surface thereof.

In further apparatus aspect analogous to the further process aspect described hereinabove, the apparatus may additionally comprise means for flowing a carrier gas past the flash vaporization matrix structure to yield a carrier gas mixture containing flash vaporized reagent source solution.

As used herein, the term "involatile reagent" refers to a solid or liquid material which has a low or negligible vapor pressure, e.g., less than about 0.1 torr at standard temperature and pressure (25° C., 1 atmosphere) conditions, but which is vaporizable by flash vaporization at elevated temperature.

As used herein, the term "flash vaporization" used in reference to the involatile reagent means vaporization of the involatile reagent wherein the period of time during which the vaporization takes place is sufficiently short so that the concentration of the vapor formed from the involatile reagent in the vaporization zone does not vary.

In a still further aspect, the invention may utilize as a solvent for the involatile reagent a liquid having an extremely low volatility, and which is non-flash vaporized under the conditions which are flash-vaporizingly effective for the involatile reagent. Under such circumstances, the non-vaporized or fraction of non-vaporized solvent may be recollected at the locus of flash vaporization and recycled for recombination with involatile reagent to form the reagent source liquid, as a solution of the solvent and involatile reagent.

Other aspects and features of the invention will be more fully apparent from the ensuing disclosure and appended claims.

DETAILED DESCRIPTION OF THE INVENTION, AND PREFERRED EMBODIMENTS THEREOF

The present invention is based on the discovery that various elements, such as the Group II metals barium, calcium, and strontium, and early transition metals such as zirconium and hafnium, for which no volatile compounds well-suited for CVD are known, may nonetheless be provided for CVD applications by (1) flash vaporizing involatile compounds thereof, or (2) dissolving involatile compounds of such elements in a suitable solvent and then flash vaporizing the resulting source reagent solution, on a suitable vaporization matrix structure.

By such expedient, close control of stoichiometry can be achieved, such as is for example critical when source materials are deposited in the formation of HTSC material films.

Figure 1:
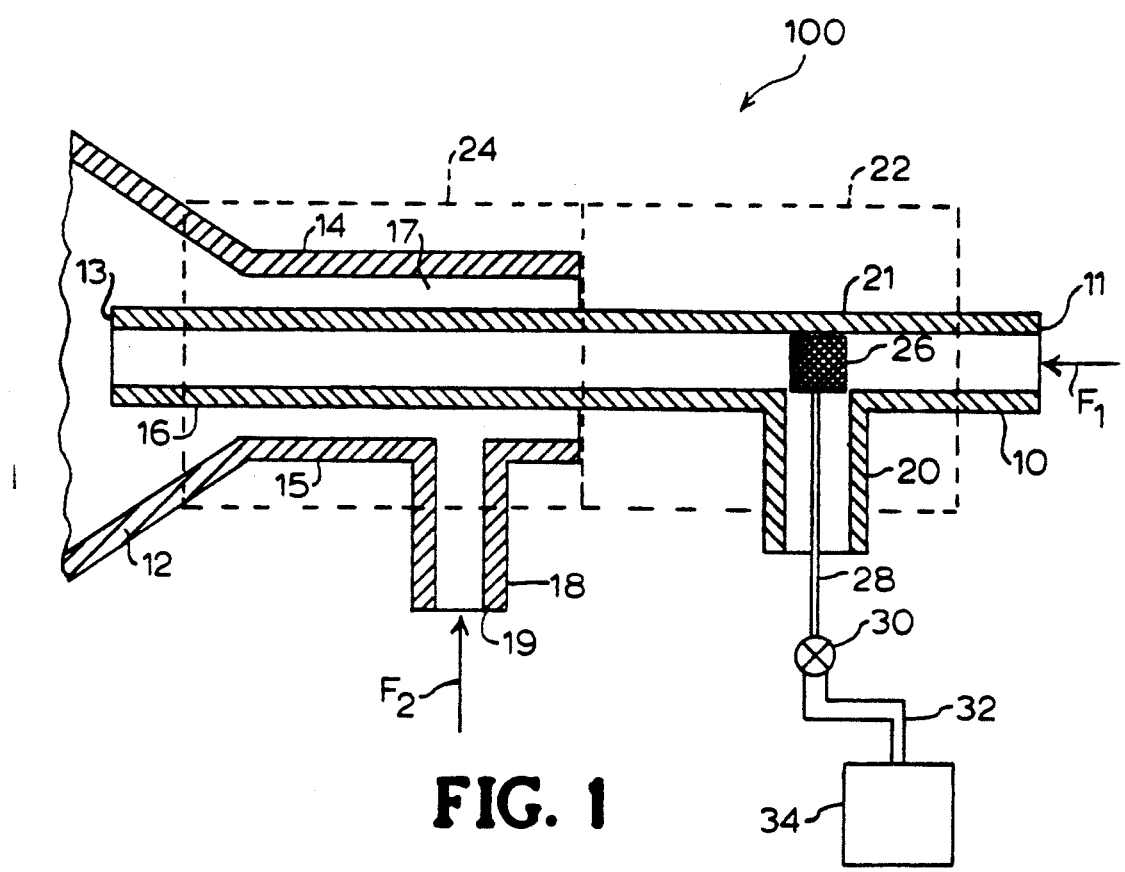
FIG. 1 is a schematic representation of a delivery system for flash vaporizing an involatile reagent.

Referring now to the drawings, FIG. 1 shows a schematic representation of a delivery system 100 for an involatile reagent.

The delivery system includes a first fluid feed passage 10, into which a first fluid is introduced in the direction indicated by arrow $F_1$. The first fluid may comprise a carrier gas, such as argon, as well as other gaseous components, e.g., volatile source compounds for elements such as copper, yttrium, etc.

The first fluid feed passage 10 is connected to a gas distribution manifold at its proximal end 11, and is open at its distal end 13. The distal portion 16 of passage 10 is mounted in a housing 12 of a reactor, such as a CVD growth chamber. The distal portion 16 of the first fluid feed passage 10 thus is centrally disposed in the cylindrical portion 15 of the reactor 12, to form an annular interior volume 17 therebetween.

Communicating with the annular interior volume 17 is a second fluid flow passage 18, into which second fluid is introduced in the direction indicated by arrow $F_2$, through the open end 19 of the passage. The second fluid introduced in passage 18 to the reactor may include other source reagent materials, or components or carrier gas species, such as oxygen and argon in the case of HTSC film formation systems.

Disposed in the proximal portion 21 of the first fluid flow passage 10 is a flash vaporization matrix structure 26, which is joined in liquid delivery relationship by conduit 28 and conduit 32, having check valve 30 therebetween, to liquid reservoir 34. Conduit 28 is sized and arranged (mounted on flash vaporization matrix structure 26) in such manner as to prevent premature evaporation of any volatile components (e.g., solvent constituents) of the source liquid flowed through conduit 28 to the vaporization matrix structure for flash vaporization thereon. The conduit 28 extends through lateral extension 20 of first fluid flow passage 10. Liquid reservoir 34 is constructed and arranged to hold a reagent source liquid, e.g., a solution comprising an involatile reagent and a suitable solvent therefor, or if the involatile reagent is a suitable liquid, then the involatile reagent alone.

The delivery system 100 shown in FIG. 1 comprises a vaporization zone 22, which may be maintained at a suitable elevated temperature commensurate with the flash vaporization of reagent source liquid on the flash vaporization matrix structure 26.

Downstream from the vaporization zone 22 is an injection zone 24, wherein the second fluid is introduced via second fluid flow passage 18. The injection zone 24 is maintained at a suitable temperature, which may be somewhat less than the temperature of the vaporization zone, depending on the various constituents introduced through the respective first and second fluid flow feed passages.

In operation, the first fluid is flowed in the direction $F_1$ through first fluid flow passage 10 into the reactor 12, being discharged at the distal open end 13 of the first fluid flow passage 10. Concurrently with such flow of gas therethrough, the reagent source liquid from reservoir 34 is flowed through conduit 32, check valve 30, and conduit 28, to the flash vaporization matrix structure 26.

The flash vaporization matrix structure 26 may be formed of any suitable material which does not deleteriously interact with the reagent source liquid or other fluid species introduced into the first fluid flow passage. The matrix structure should also be heatable to sufficient elevated temperature to effect flash vaporization of the reagent source liquid which is introduced from conduit 28 onto the surfaces of the matrix structure. The matrix structure may for example be formed of metals such as stainless steel, copper, silver, iridium, platinum, etc., as well as ceramics, high temperature glasses, composite materials, and the like, the choice of a specific material of construction being dependent on the temperature regime which is encountered by the matrix structure, as well as the composition of the reagent source liquid and fluid flowed past the structure in the first fluid flow passage 10. Preferably, the matrix structure is constructed of an inert metal, and has a relatively high surface-to-volume ratio, as for example at least about 4, when the surface and volume are measured in corresponding area and volume dimensional units (viz., square and cubic values of the same dimensional units). Preferably the matrix structure is foraminous (i.e., porous or perforate) in character.

The flash vaporization matrix structure may take the form of a screen, porous sintered material body, grid, or the like, as described hereinafter in greater detail. The composition, surface area, and surface-to-volume characteristics of the matrix structure are selected so as to effect flash vaporization of the involatile reagent source liquid on the surfaces of the structure, near contemporaneously with application of liquid thereon.

The conduit 28 introducing the reagent source liquid onto the matrix structure 26 may simply be an open-ended tube, i.e., a tube whose open end communicates with the matrix structure, whereby liquid issuing from the conduit flows onto the surfaces of the matrix structure for flash vaporization thereon, when the grid is heated to suitable elevated temperature. As previously discussed, conduit 28 is appropriately sized and arranged relative to the vaporization matrix structure 26 to prevent any undesirable premature evaporation of the reagent source liquid before the flash vaporization thereof on the matrix structure.

In order to enhance the dispersion and distribution of reagent solution onto the surfaces of the matrix structure, the conduit 28 may have a restriction rod (not shown) centrally disposed therein to form an interior annular conduit, whereby pressure drop in the conduit is reduced to a desired level, and whereby liquid issues in a thin film onto the matrix structure surfaces. Alternatively, the conduit 28 may be joined to a suitable nozzle or distributor means (not shown) at the distal end of the conduit, to facilitate distribution of reagent source liquid onto the matrix structure surfaces.

The reagent solution reservoir 34 may be associated or otherwise coupled with a suitable liquid pumping means (not shown), such as a positive displacement liquid pump which effects discharge of reagent source liquid from the reservoir through conduit 32, check valve 30, and conduit 28 to the matrix structure 26. The reagent source liquid may be introduced onto the vaporization matrix structure in a steady stream injection mode or in a pulsed injection mode from the conduit 28. In general, steady stream injection of the reagent source liquid is desirable in CVD applications since it provides the most stable concentration of the source reagent in the downstream reactor, however pulsed injection of the reagent source liquid may be advantageous in some applications.

Preferably, the matrix structure 26 is formed of a material of construction having a high specific heat capacity, so that the structure is substantially unaffected by heat of vaporization effects, whereby the matrix structure is suitably maintained at a desirable elevated temperature for continuous operation and vaporization of the reagent source liquid. Materials of construction which may contaminate the deposited films sought to be formed from the source reagent liquid, e.g., iron, should be avoided in the practice of the invention, in applications where the composition and stoichiometry of the deposited film are critical.

The check valve 30 between conduits 28 and 32 controls the on/off flow of reagent source liquid therethrough to the matrix structure 26 and is required to prevent the uncontrolled delivery of the source reagent solution to the matrix structure 26 under reduced pressure operating conditions.

The reagent source liquid delivered to the heated matrix structure 26 is vaporized and then carried by a first fluid (carrier gas) into the deposition reaction chamber 12. The first fluid may also comprise other reagents from various upstream bubblers or other source means therefor.

Figure 2:
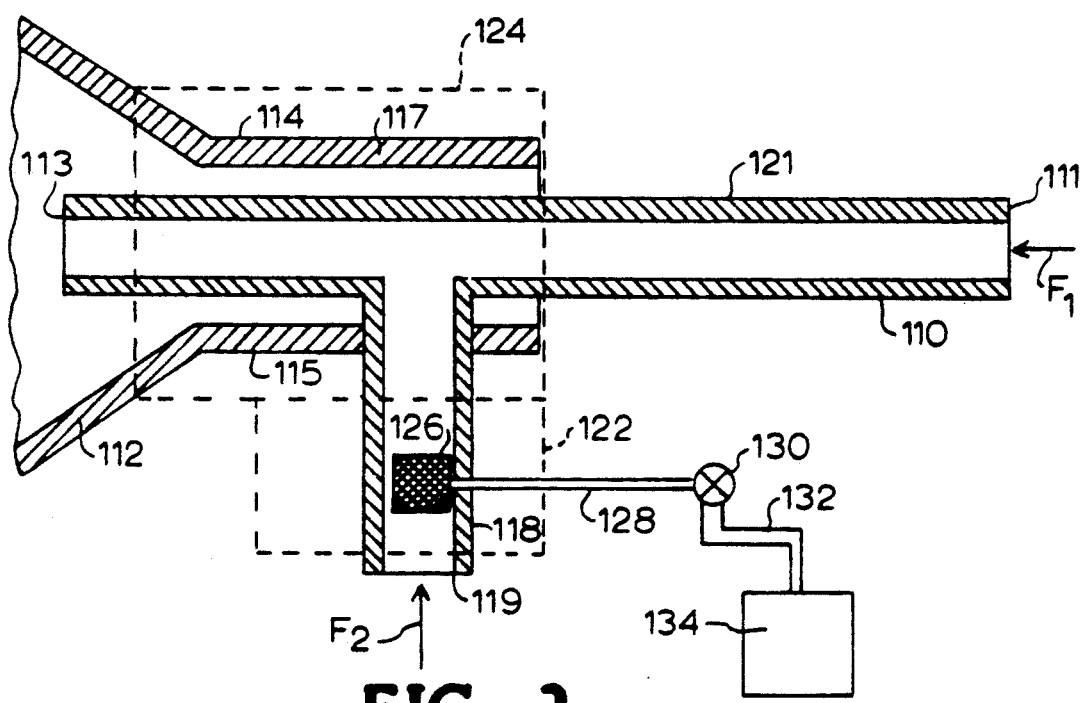
FIG. 2 is a schematic representation of another delivery system for flash vaporizing an involatile reagent.

FIG. 2 is a schematic representation of another delivery system for flash vaporizing an involatile reagent, which is numbered correspondingly with respect to FIG. 1, by addition of 100 to all reference numerals of corresponding parts and elements of the FIG. 1 system.

The FIG. 2 system is constructed and arranged correspondingly to the FIG. 1 system, with the exception that the vaporization matrix structure 126 is disposed in the second fluid flow passage 118 in the FIG. 2 system, rather than being disposed in the proximal portion of the first fluid flow passage as shown and described with respect to the FIG. 1 system. In connection with such difference, the first fluid flow passage 110 in the FIG. 2 system does not have a lateral extension at the proximal end of the first fluid flow passage, as does the FIG. 1 system. By the arrangement shown in FIG. 2, the flash-vaporized reagent source liquid flows with the gas introduced into second fluid flow passage 118, to the annular interior volume 117 and to the housing 112 of a reactor, e.g., a CVD growth chamber. The second fluid which is introduced in second fluid flow passage 118 to the reactor may include any suitable source reagent materials, components, or carrier gas species, as previously described in connection with FIG. 1. In all other respects, the FIG. 2 system may be operated correspondingly to the FIG. 1 system, to provide the flash-vaporized involatile reagent to the desired processing locus.

The delivery system embodiments illustratively described hereinabove can be used with any deposition reactor configuration and heating method. Examples of suitable deposition reactor and heating modalities include horizontal reactors with infrared (IR) heating, vertical reactors with resistive heating, and vertical reactors with inductive heating.

The delivery system of the present invention is broadly applicable to application of flash vaporized involatile reagent materials to substrates by MOCVD, plasma enhanced chemical vapor deposition (PECVD), photoassisted-CVD, other forms of assisted-CVD, and conventional thermal CVD, with the choice of the specific deposition technique being within the skill of the art, as regards any particular film formation application.

The invention is broadly useful for the deposition of films from source reagents whose decomposition temperatures are close to their sublimation temperatures. The source reagent in the delivery system of the present invention is only required to be at its vaporization temperature for a brief instant. Prior to its vaporization, the reagent source liquid can be maintained at room temperature, with refrigeration of the reagent liquid reservoir being possible (and in some cases desirable).

As a result of such flash vaporization capability, the delivery system of the present invention effectively minimizes the heat required in the provision of the reagent in gaseous form to the deposition (growth) chamber.

The involatile reagent source liquid in the broad practice of the present invention may consist essentially of only the involatile reagent itself, when same is in the form of a low volatility liquid. Such "neat" liquid is introduced to the vaporization matrix structure to form the involatile reagent vapor which then is flowed to the desired use locus. It may also be feasible in the broad practice of the present invention to effectively utilize two or more involatile reagent species, which in combination with one another form a suitable source liquid, such as where a first, solid involatile reagent is soluble in a second, liquid involatile reagent.

Alternatively, and more typically, a solid involatile reagent is dissolved in a non-reagent solvent to form a reagent source liquid solution, which then is flash vaporized on the flash vaporization matrix structure for subsequent delivery to the locus of use.

It is also within the purview of the invention to provide a plurality of involatile reagent species in a suitable solvent medium to form a source liquid solution. Regardless of the number of involatile reagent species employed, the solvent medium may be widely varied, and may comprise single component solvents as well as multicomponent solvent mixtures, with the choice of a specific solvent medium being readily determinable for a given involatile reagent or reagents, and the specific flash vaporization apparatus and flash vaporization conditions employed.

It is also within the broad purview of the present invention to utilize a solution of an involatile reagent as the source liquid for flash vaporization, wherein the solvent has an extremely low volatility such that it is not vaporized during the flash vaporization of the involatile reagent from the solution, but remains in the liquid state. In this manner, the source liquid introduction means and the flash vaporization matrix structure may be arranged and operated so that the non-vaporized solvent is collected at or proximate to the site of flash vaporization, and recirculated for reuse. The advantage of such arrangement and operation of the system is that the solvent medium does not become associated with the flash vaporized involatile reagent, and thus is not carried with the vapor-phase reagent into the downstream reactor or other downstream processing locus, such as is the case when the solvent is co-flashed with the involatile reagent. By utilizing a solvent which is non-vaporized on the vaporization matrix in CVD applications, the solvent is not carried into the deposition reactor where it could otherwise contaminate the growing film. As an example, in plasma enhanced CVD growth, contamination of the growing film by an organic solvent may create problems which render the product film deficient or even useless for its intended purpose.

An illustrative example of a non-flashing low volatility solvent which may be usefully employed in the broad practice of the present invention is the perfluorinated ether commercially available under the trademark Krytox ®, which may be employed for example with a tetraglyme adduct dissolved therein to provide the reagent source liquid for flash vaporization.

When a solvent is employed to dissolve the involatile reagent and form a reagent source solution thereof for subsequent flash vaporization of the involatile reagent, the solvent must meet certain criteria. When the solvent is to be co-flashed with the involatile reagent, the solvent medium should be more volatile than the source reagent itself. In such case, the solvent medium should not react with the reagent to form a less volatile product. With respect to the interaction between the solvent and the involatile reagent, three vaporization scenarios are possible, in order of decreasing solvent flashing effectiveness:

(1) The solvent forms an adduct with the molecule of interest, the adduct having enhanced volatility;

(2) The solvent strongly associates with the molecule of interest, and forms a non-ideal gas during vaporization, thereby increasing the effective vapor pressure of the source reagent; and (3) The solvent only weakly interacts with the source reagent, and these two species co-vaporize with little or no enhancement of the vapor pressure of the molecule of interest.

Alternatively, a fourth scenario appropriately describes the use of a non-flashing low volatility solvent:

(4) The solvent only weakly interacts with the source reagent, so that the source reagent is vaporized with little or no enhancement of the vapor pressure of the molecule of interest, but the solvent has extremely low volatility and remains in the liquid state, or else quickly recondenses in proximity to the flash vaporization matrix structure, so that the solvent may be readily collected for reuse in the system.

The specific choice of solvent for a given reagent deposition application will depend on the composition of the reagent and solubility of the reagent in the selected solvent. The choice of a specific solvent thus may be made without undue experimentation by those skilled in the art, based on simple compatibility, solubility, and vaporization tests.

Depending on the identity of the specific reagent compound to be dissolved therein and subsequently flash vaporized, potentially usefully employed co-flash vaporizable solvents in the broad practice of the present invention include alkanolic solvents and alcohols generally, as well as ethers, and amines. The solvent should not contain any materials, or decompose to form any materials, which deleteriously contaminate the films or layers deposited from the vaporized source reagent solution. For this purpose, sulfoxide solvents should not be used in the formation of HTSC layers on substrates, since the sulfoxide solvent will contaminate the resulting HTSC film. When the solvent is to be maintained in the liquid phase while the involatile reagent is flash vaporized from a reagent source liquid containing the involatile reagent, halogenated organic solvents such as the Krytox ® perfluorinated ether may be employed, as previously discussed.

Although the involatile reagent delivery system of the invention has been described with reference to the embodiments of FIGS. 1 and 2, as involving a carrier gas with which the flash vaporized involatile reagent is mixed to form a resulting source gas mixture for subsequent processing, it is within the broad purview of the present invention to operate without the provision of any carrier gas, so that the flash vaporized material is flowed without any additional components or materials to the downstream treatment or processing locus. This may be effected by operating a downstream processing chamber, e.g., a CVD growth reactor, at a pressure below that of the flash vaporization chamber, so that the flashed vapor flows under the differential pressure conditions from the vaporization chamber to the downstream processing chamber.

The involatile reagent employed in the broad practice of the present invention may be of any of widely varying types, depending on solvent employed and the specific end use application for which the reagent is intended.

Potentially useful involatile reagents in the broad practice of the present invention include Group II reagents, such as organometallic compounds and complexes of Group II elements.

By way of example, in the formation of Group II metal fluoride (e.g., $BaF_2/CaF_2/SrF_2$) interlayers, between silicon substrates and HTSC or GaAs overlayers, suitable Group II involatile source reagents may comprise: barium 1,1,1,2,2,3,3-heptafluoro-7,7-dimethyl-octane-4,6-dionate, hereafter denoted $Ba(fod)_2$; calcium 1,1,1,2,2,3,3-heptafluoro-7,7-dimethyl-octane-4,6-dionate, hereafter denoted $Ca(fod)_2$; strontium 1,1,1,2,2,3,3-heptafluoro-7,7-dimethyl-octane-4,6-dionate, hereafter denoted $Sa(fod)_2$; hexafluroacetylacetonate compounds of barium, calcium, and strontium; and adducts of such hexafluoroacetylacetonate compounds with tetraglyme.

In the formation of HTSC films of BiSrCaCuO by MOCVD, wherein the strontium and calcium reagents are introduced as vaporized reagent solutions of the materials, the calcium involatile reagent may be $Ca(fod)_2$ and the strontium reagent may be $Sr(fod)_2$.

$Ba(fod)_2$; barium hexafluroacetylacetonate; barium hexafluroacetylacetonate/tetraglyme adduct; 1,2,3,4,5-pentamethyl-1,3-cyclopentadienyl barium; and barium bis(2,2,6,6-tetramethyl-3,5-heptanedione) may suitably be employed as involatile Group II reagents for barium in the MOCVD formation of HTSC films of the "123" type ($YBa_2Cu_3O_x$, wherein x is from about 6.0 to about 7.3).

The present invention is generally applicable to the delivery of Group II elements from Group II beta-diketonate source reagent compounds, including the aforementioned $Ba(fod)_2$, $Ca(fod)_2$, and $Sr(fod)_2$ compounds. For the Group II beta-diketonate source reagent compounds, alcohols generally are preferred as solvent species, particularly alkanolic solvents, e.g., isopropanol, butanol, and the like.

Figure 3:
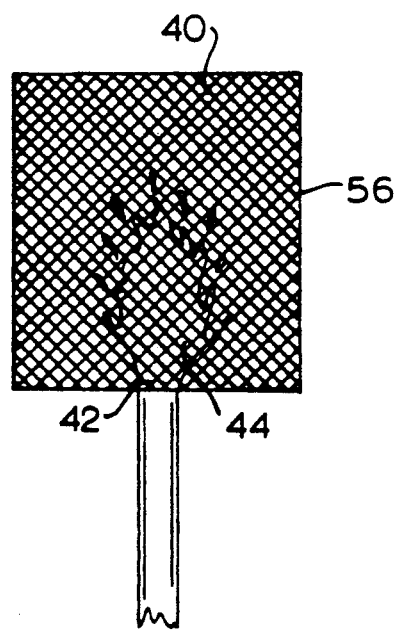
FIG. 3 is a front elevation view of a flash vaporization matrix structure of the FIG. 1 system.

FIG. 3 is a front elevation view of the flash vaporization matrix structure 26 which is shown in FIG. 1, as associated with reagent source liquid feed conduit 28.

The matrix structure 26 may suitably comprise a screen 40 formed of criss-crossed wire strands yielding a foraminous structure, to which the distal end 42 of reagent source liquid feed conduit 28 is suitably attached, e.g., by welding, brazing, or the like. In such manner, fluid flow communication is provided between the interior passage of conduit 28 and the matrix structure 26, to effect flow of liquid 44 from the conduit onto the surfaces of the matrix structure 26, for vaporization of the reagent source liquid thereon.

Figure 4:
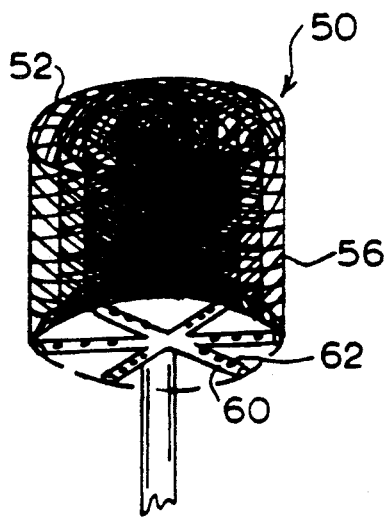
FIG. 4 is a perspective view of an alternative flash vaporization matrix structure.

FIG. 4 shows a perspective view of another flash vaporization matrix structure assembly 50, comprising a spiral wound screen 52, to the lower end 54 of which is joined a liquid distributor 56, which in turn is joined to and fed by reagent source liquid feed conduit 58. The distributor assembly 56 comprises a series of radially extending arms 60, which in turn have liquid flow openings 62 on their upper portions, to accommodate discharge of liquid therethrough, as supplied by the feed conduit 58.

In operation of the FIG. 4 assembly, reagent source liquid flows through feed conduit 58 into the arms 60 of the distributor assembly 56 and is discharged through openings 62 in the form of fine jets of liquid onto the surfaces of the screen mesh 52 which is at elevated temperature, for vaporization on the surfaces thereof.

Figure 5:
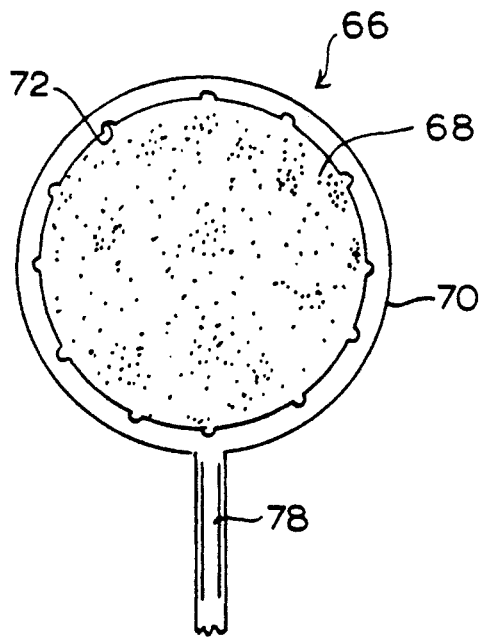
FIG. 5 is a front elevation view of a still further embodiment of a flash vaporization matrix structure.

FIG. 5 is a front elevation view of another flash vaporization matrix structure assembly 66, which features a porous sintered metal disk 68 which about its periphery is circumscribed by a distributor ring 70 having openings 72 on its inner surface. The ring 70 is hollow in its interior to define a flow passage therein. This interior flow passage is in flow communication with the reagent source liquid feed conduit 78, which in turn is joined in closed flow communication to ring 70.

In operation of the FIG. 5 assembly, reagent source liquid is flowed through feed conduit 78 into ring 70 and issues through the inner openings 72 thereof onto the surfaces of the porous sintered metal matrix 68. The sintered metal matrix is maintained at elevated temperature, for vaporization of the reagent source liquid thereon.

Figure 6:
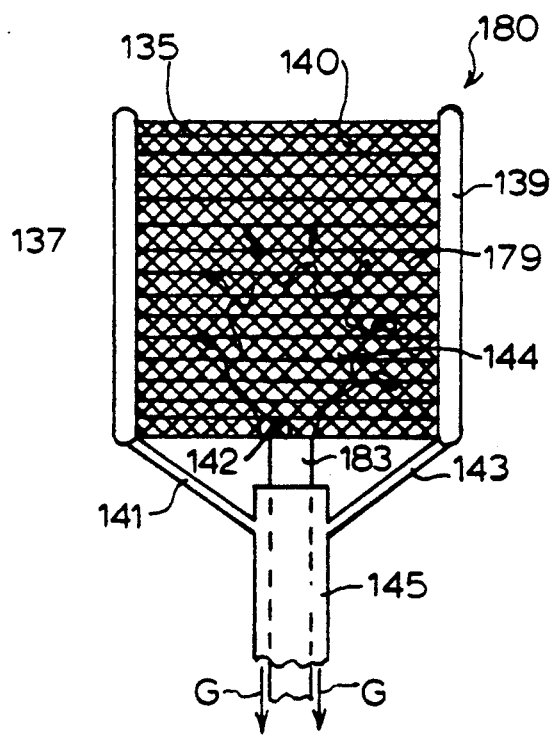
FIG. 6 is a front elevation view of a flash vaporization matrix structure, of a type suitable for use with a carrier solvent having extremely low volatility, and comprising means for recovery and, if desired, recirculation of the carrier solvent.

FIG. 6 is a front elevation view of a flash vaporization matrix structure which may be employed to flash vaporize reagent source liquid comprising a non-vaporized solvent which is recovered for reuse, contemporaneously with the flash vaporization of the involatile reagent from the reagent source liquid introduced onto the vaporization matrix structure.

Referring to FIG. 6, the flash vaporization assembly 180 comprises a vaporization matrix structure 179, which is associated with a reagent source liquid feed conduit 183. The matrix structure 179 may suitably comprise a screen 140 formed of wire mesh elements providing a foraminous member. The matrix structure 179 is attached to the distal end 142 of the reagent source liquid feed conduit 183 in any suitable manner of affixation, to provide fluid flow communication between the interior passage of conduit 183 and the matrix structure 179. By this arrangement, liquid 144 is flowed from conduit 183 onto the surfaces of the screen 140, with the screen being maintained at suitably high temperature, to effect flash vaporization of the involatile reagent source compound from the source liquid comprising same.

The FIG. 6 flash vaporization assembly is particularly adapted for the recovery of a non-vaporized solvent from the source liquid 144, by the provision of transverse wick elements 135. The transverse wick elements extend across the screen 140 and terminate at the margins of the screen, in wicking flow communication with the manifold members 137 and 139, respectively. The manifold members 137 and 139 in turn are connected in liquid flow communication, means of by branch return conduits 141 and 143, respectively, to return conduit 145. As is shown, the return conduit 145 concentrically surrounds the liquid feed conduit 183, to provide an annular flow space therebetween, whereby recovered solvent is returned to the feed reservoir or other collection locus, flowing in the direction indicated by the arrows G.

In operation of the FIG. 6 flash vaporization assembly, liquid 144 is injected by feed conduit 183 onto the surfaces of screen 140, which as indicated is maintained at suitably high temperature to effect flash vaporization of the involatile reagent. The liquid 144, which comprises the involatile reagent in a non-vaporizable solvent, thus is separated into the flashed involatile reagent component, and the non-vaporized solvent which remains on the screen 140, and then is wicked transversely by the wicking elements 135 to the manifolds 137 and 139 at the margins of the screen. Liquid collected in the manifolds 137 and 139 flows by branch lines 141 and 143, respectively, to the return conduit 145 for reuse.

It will be appreciated that other collection means and methods may be employed to recover a solvent from the flashed, or flashing, involatile reagent source liquid, within the broad practice of the present invention.

It will be recognized that the vaporization matrix may be provided in a structural form which can be widely varied, depending on the nature of the liquid to be flash vaporized thereon, and the operating conditions and end use application for the reagent material of interest. Thus, for example, the flash vaporization matrix structure could comprise a permeable housing or "cage" filled with tiny particulate packing elements providing extending surface area, for flash vaporization of reagent source liquid solution introduced thereonto when the packing material is maintained at elevated temperature. Alternatively, the structure of the flash vaporization matrix may embody a wick element serving to draw reagent source liquid onto its surfaces from an associated liquid feed conduit by capillary action.

Accordingly, the term "flash vaporization matrix structure" is to be broadly construed to include all suitable physical structures comprising physical element(s) which are arranged to receive a liquid (reagent source liquid) from a suitable source thereof, and to flash vaporize the received liquid when the physical element(s) are heated to a sufficiently high flash vaporization temperature for the specific liquid employed.

The flash vaporization matrix structure may be maintained at suitably high elevated temperature to effect flash vaporization of the reagent source liquid thereon in any suitable manner. For example, the matrix structure may be maintained at elevated temperature by virtue of convective heat transfer from an elevated temperature carrier gas flowed past the structure, so that the sensible heat of the flowing gas stream is employed to maintain the flash vaporization matrix structure at a desired temperature level.

Alternatively, the matrix structure may be provided with a suitable source of heating energy, such as means for infrared (IR) heating of the structure, e.g., an IR lamp disposed proximate to the first fluid flow passage in the vicinity of an IR-transmissive window in the first fluid flow passage, so that radiant IR energy is transmitted therethrough to heat the matrix structure.

Alternatively, the matrix structure itself may be a resistance heating element in an electrical circuit therefor, such as where the matrix structure is formed of a suitable metal or other material capable of being resistance heated.

The choice of specific heating modality for the flash vaporization matrix structure will depend on the reagent source liquid, carrier gas, and other species employed, as well as the form and material of construction of the matrix structure itself. Suitable heating arrangements may readily be determined in a specific end use application by those of ordinary skill in the art, without undue experimentation.

The features and advantages of the present invention are more fully shown with respect to the following non-limiting examples, wherein all parts and percentages are by weight unless otherwise expressly stated.

EXAMPLE I

An isopropanol solution of $Ba(fod)_2$ and $Ca(fod)_2$ is made up, containing 4% percent by weight of the barium reagent and 4% percent by weight of the calcium reagent, based on the weight of solvent in the solution. The resulting barium/calcium reagent solution is employed at ambient temperature (approximately 25° C.) and injected into the first fluid flow passage of a delivery system of the type which is schematically shown and described with reference to FIG. 1 hereof.

The barium reagent, calcium reagent, and isopropanol were vaporized and carried into the reactor to form a layer of barium fluoride/ calcium fluoride ($BaF_2$/$CaF_2$) on a silicon substrate. The vaporization zone temperature in the delivery system was maintained at approximately 250° C. The carrier gas was argon, at a flow rate of 100 cubic centimeters per minute ($cm^3$/min.) These conditions ensured that flash vaporization was achieved.

The barium and calcium concentrations inside the deposition reactor were controlled by varying the rate of addition of the isopropanol reagent solution and/or the molarity of the reagent solution. These flash vaporization techniques prevented the premature decomposition of the barium and calcium reagents, since the related complexes were at their vaporization temperatures only for a brief instant rather than for the entire time period of the deposition run, which was on the order of 4 hours. As a consequence, the partial pressure of the Group II reagents inside the reactor remained constant, and the barium fluoride/calcium fluoride stoichiometry and delivery were closely controllable to provide a desired layer thereof on the substrate.

EXAMPLE II

Using a reagent delivery system of the type shown in FIG. 1 hereof, $SrF_2$/$CaF_2$ films were deposited on Si(100) at a substrate temperature of 500° C. and reactor pressure of 1 torr. MOCVD was carried out with an oxygen to argon ratio of 1; however, no carbon was observed by EDS (sensitivity ca. 1%) at ratios ranging from 0.1 to 2. The as-deposited films were polycrystalline and a linear relationship was observed between the total growth rate and the delivery rate of the Group II organometallic sources, which indicate that mass transfer limited growth was achieved. Under these conditions the relative molar concentrations of the Sr and Ca in the film were directly proportional to their molar ratio in the inlet stream; fluorine was identified by EDS analysis.

EXAMPLE III

A delivery system of the type schematically shown in FIG. 2 hereof was employed to deliver strontium and calcium source reagents to the deposition reactor in the MOCVD of BiSrCaCuO HTSC films.

The bismuth source reagent was bismuth ethoxide, $Bi(OC_2H_5)_3$, the calcium and strontium source reagents were calcium and strontium bis(2,2-dimethyl-6,6,7,7,8,8,8-heptafluoro-3,5-octanedionates), and the copper source reagent was copper bis(hexafluoroacetylacetonate). MOCVD of BiSrCaCuOF was carried out at 500° C. and 2 torr at an oxygen to argon ratio of 1. The reactor parameters are set out in Table I below.

TABLE I

| Run No. | Delivery Rate (mmol/min) | | Carrier Flow Rate (Cm³/min) | | Growth Rate (mg/min) | Stoichiometry |
|---|---|---|---|---|---|---|
| | Ca | Sr | Bi | Cu | | |
| 1* | 46.1 | 33.0 | 50 | 70.4 | 54.7 | — |
| 2 | 38.3 | 27.4 | 25 | 44 | 22.6 | — |
| 3 | 511 | 366 | 25 | 38 | 37.3 | 2-4.5-2.4-3.7 |
| 4 | 210 | 238 | 25 | 32 | 31.5 | 2-1.5-1.0-2.8 |
| 5 | 287 | 325 | 25 | 32 | 33.3 | 2-2.4-1.9-3.8 |
| 6 | 257 | 291 | 25 | 24 | ** | 2-2.4-2.1-3.0 |
| 7 | 296 | 336 | 25 | 24 | 33.2 | 2-2.4-2.5-3.8 |
| 8 | 295 | 335 | 30 | 30 | 33.6 | 2-5.9-2.9-5.6 |
| 9 | 286 | 325 | 25 | 24 | ** | 2-2.1-1.9-2.2 |
| 10 | 290 | 329 | 25 | 24 | ** | — |
| 11 | 299 | 339 | 25 | 24 | ** | 2-11-6.8-6.7 |
| 12 | 295 | 335 | 30 | 30 | ** | 2-4.4-3.6-3.5 |

\# Bismuth bubbler held at 180° C., copper bubbler held at 60° C., substrate is Si(100).
§ Normalized to the area of a 2 in diameter silicon wafer (20.3 cm²).
\*Reactor pressure was 4 torr, Bi bubbler at 180° C.
\*\*Pt and Pt/W fiber substrates The growth rate under these conditions was 0.5 to 1 microns/hour.

The BiSrCaCuO/MgO(100) films were annealed by the following sequence of steps:

1.) heating to 870° C. at 30° C./minute in flowing oxygen saturated with water at 20° C.;
2.) holding the temperature at 870° C. for 2 hours in wet oxygen; switching the flow of water off and maintaining the oxygen flow for an additional 3 hours; and
3.) cooling to room temperature in flowing oxygen at 30° C./minute.

The post annealed films are nearly smooth with an average grain size of 6 to 10 microns. The resistive transitions have onsets of 110° K. and are fully superconducting by 80° K. Energy dispersive X-ray analysis indicates that all the fluorine has been removed by this treatment. The high transition temperature and planar morphology are indicative of c-axis oriented growth.

EXAMPLE IV

A solution of barium bis(2,2,6,6-tetramethyl-3,5-heptanedione), at a concentration of 0.6 g Ba/100 cc solution, is pumped onto a metallic surface that comprises the flash vaporization zone for the barium source compound. The temperature of this vaporization surface is measured with a thermocouple, and held at 220° C. This region is in the Ti manifold, where $Ti(OP)_4$ is carried by dry argon gas at 100 sccm. The molar fraction of Ti in this gas is controlled by using a throttle valve in the manifold to adjust the total pressure at the $Ti(OP)_4$ bubbler. The bubbler is held at 50° C. The Ti manifold is maintained at 100° C. to prevent condensation of the Ti reagent.

The Ba and Ti carrying gas enters the vertically oriented reactor at the bottom. At this point oxygen is also entering the reactor, at 100 sccm. Total pressure at the substrate is approximately 1.0 torr. The relative partial pressure of Ti and Ba at the substrate are controlled by varying the pumping rate of the barium source compound solution and the total pressure at the $Ti(OP)_4$ bubbler.

Si [100] and $SrTiO_3$ [100] substrates are used for film growth. The substrate temperature is 850° C. It is heated by contact with a SiC susceptor, which is inductively heated by a 400 KHz EMF, originating in coils outside the reactor. Film growth duration is typically 1 hour; reactor evacuation, purge sequences, heat up and cool down make the entire growth process last about 3 hours.

The films are characterized by SEM/EDS and XRD. The former is used to determine growth morphology and approximate stoichiometry. The latter is used to determine crystalline phases present, including their orientation and in both cases, a-axis oriented $BaTiO_3$ are formed.

While the invention has been described with reference to specific aspects, features, and embodiments thereof, it will be apparent that various modifications, variations, and embodiments are possible, and accordingly the invention is to be broadly construed with respect to all such modifications, variations, and embodiments, as being within the spirit and scope of the invention.

What is claimed is:

1. A process for delivering an involatile solid source reagent material having a vapor pressure of less than about 0.1 torr at 25° C. and 1 atmosphere conditions, and which is thermally unstable at its vaporization temperature, as a source regent material vapor into a CVD reactor, said process comprising:

providing a supply vessel containing a reagent source liquid formed by dissolving the involatile solid source reagent material in a non-azotropic organic solvent, wherein the reagent source liquid is contained in the supply vessel in a non-heated state, at or below room temperature;

arranging a flash vaporization structure comprising a foraminous element having a surface-to-volume ratio of at least 4, in liquid flow communication with the supply vessel containing the reagent source liquid;

heating the foraminous element to a flash vaporization temperature for the involatile solid source reagent material; and flowing the reagent source liquid from the supply vessel to the heated foraminous element, with the reagent source liquid in a non-atomized state directly issuing a liquid stream of the reagent source liquid onto the heated foraminous element, and flash vaporizing the involatile solid source material from the reagent source liquid to form the source reagent material vapor.

2. A process according to claim 1, wherein the involatile solid source reagent material comprises inorganic and/or organometallic compound(s).

3. A process according to claim 1, wherein the solvent comprises a solvent selected from the group consisting of alcohols, ethers, and amines.

4. A process according to claim 1, wherein the solvent comprises an alkanolic solvent.

5. A process according to claim 1, comprising the further step of flowing a carrier gas past the flash vaporization structure to form a carrier gas mixture containing the source reagent material vapor.

6. A process according to claim 5, comprising the further step of flowing the carrier gas mixture into a CVD reaction zone, and depositing a constituent of the source reagent material vapor on a substrate therein.

7. A process according to claim 5, wherein the carrier gas comprises an inert gas.

8. A process according to claim 1, wherein the involatile solid source reagent material comprises a beta-diketonate source reagent.

9. A process according to claim 1, wherein the involatile solid source reagent material comprises an element selected from the group consisting of barium, calcium, strontium, zirconium, and hafnium.

10. A process according to claim 1, wherein the involatile solid source reagent material comprises at least one material selected from the group consisting of Ba(fod)$_2$, Ca(fod)$_2$, and Sr(fod)$_2$.

11. A process according to claim 1, wherein the involatile solid source reagent material comprises at least one material selected from the group consisting of Ba(fod)$_2$; barium hexafluoroacetylacetone; barium hexafluoroacetylacetone/tetraglyme adduct; 1,1,3,4,5-pentamethyl-1,3-cyclopentadienyl barium; and barium bis(2,2,6,6-tetramethyl-3,5-heptanedione).

12. A process according to claim 1, wherein the involatile solid source reagent material comprises at least one material selected from the group consisting of Ca(fod)$_2$; calcium hexafluoroacetylacetone; calcium hexafluoroacetylacetone/tetraglyme adduct; 1,1,3,4,5-pentamethyl-1,3-cyclopentadienyl calcium; and calcium bis(2,2,6,6-tetramethyl-3,5-heptanedione).

13. A process according to claim 1, wherein the involatile solid source reagent material comprises at least one material selected from the group consisting of Sr(fod)$_2$; strontium hexafluoroacetylacetone; strontium hexafluoroacetylacetone/tetraglyme adduct; 1,1,3,4,5-pentamethyl-1,3-cyclopentadienyl strontium; and strontium bis(2,2,6,6-tetramethyl-3,5-heptanedione).

14. A process according to claim 1, wherein the flash vaporization structure comprises a foraminous element selected from the group consisting of screen elements, porous sintered material elements, and grid elements.

15. A process according to claim 1, wherein the flash vaporization structure comprises a fine mesh screen.

16. A process according to claim 12, wherein the surface-to-volume ratio is at least 10.

17. A process according to claim 1, wherein the involatile solid source reagent material comprises a Group II beta-diketonate material, and the solvent comprises an alkanolic solvent.

18. A process according to claim 1, wherein the reagent source liquid comprises (i) the involatile solid source reagent material and (ii) a solvent which has sufficiently low volatility so that it is non-vaporized under conditions which are flash vaporizingly effective for the involatile solid source reagent material on the heated foraminous element, said process further comprising the step of recovering the solvent and recirculating same for make-up of the reagent source liquid.

19. A process according to claim 18, wherein the solvent is recovered at a locus in proximity to the flash vaporization structure.

20. A process according to claim 1, further comprising the steps of flowing the source reagent material vapor to a CVD reaction zone, and depositing a component of the source reagent material vapor on a substrate therein.

21. A process according to claim 18, wherein the solvent comprises a perfluorinated ether.

22. A process according to claim 20, wherein a tetraglyme adduct of the involatile solid source reagent material is dissolved in the perfluorinated ether, to form the reagent source liquid.

23. A method of forming a composite article comprising a silicon or gallium arsenide substrate comprising:
   forming on the silicon or gallium arsenide substrate a graded epitaxial layer comprising at least two metal fluorides selected from the group consisting of barium fluoride, calcium fluoride, and strontium fluoride by CVD using metal involatile solid source reagent compounds therefor,
   wherein the metal involatile solid source reagent compounds are supplied in a source reagent compounds vapor, by a process comprising:
   dissolving each of the involatile solid source reagent compounds, which are thermally unstable at their vaporization temperatures, in a non-azeotropic organic solvent to form a reagent source liquid, wherein the reagent source liquid is maintained in a non-heated state, at or below room temperature;
   providing a foraminous element having a surface-to-volume ratio of at least 4;
   heating the foraminous element to a flash vaporization temperature for the involatile solid source reagent compounds; and
   flowing reagent source liquid in a non-atomized state as a liquid stream onto the heated foraminous element, and flash vaporizing the involatile solid source reagent compounds from the reagent source liquid to form the source reagent compounds vapor; and
   forming on the graded metal fluoride epitaxial layer an overlayer of a material selected from the group consisting of silicon, gallium arsenide, and copper oxide HTSC materials, with the proviso that the overlayer material is different from the material of the substrate.

24. A method according to claim 23, wherein the substrate comprises silicon, and the overlayer comprises an HTSC material.

25. A method according to claim 24, wherein the graded epitaxial layer is selected from layers of the group consisting of (BaF$_2$/CaF$_2$), (SrF$_2$/CaF$_2$), and (BaF$_2$/CaF$_2$/SrF$_2$).

* * * * *

UNITED STATES PATENT AND TRADEMARK OFFICE
CERTIFICATE OF CORRECTION

PATENT NO.  : 5,204,314
DATED       : April 20, 1993
INVENTOR(S) : Peter S. Kirlin, et al It is certified that error appears in the above-identified patent and that said Letters Patent is hereby corrected as shown below:

Column 17, line 51, change "claim 12" to --claim 1--.

Signed and Sealed this

Twelfth Day of July, 1994

Attest:

BRUCE LEHMAN

*Attesting Officer*  *Commissioner of Patents and Trademarks*